(12) United States Patent
Saito

(10) Patent No.: US 8,558,562 B2
(45) Date of Patent: Oct. 15, 2013

(54) METHOD AND CIRCUITRY FOR IDENTIFYING TYPE OF PLUG CONNECTED TO A DUAL-USE JACK

(75) Inventor: Naotaka Saito, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 304 days.

(21) Appl. No.: 12/926,275

(22) Filed: Nov. 5, 2010

(65) Prior Publication Data

US 2011/0128019 A1 Jun. 2, 2011

(30) Foreign Application Priority Data

Nov. 27, 2009 (JP) ................................. 2009-270059

(51) Int. Cl.
*G01R 27/08* (2006.01)
*H04R 1/10* (2006.01)

(52) U.S. Cl.
USPC ............................... 324/691; 324/713; 381/74

(58) Field of Classification Search
None
See application file for complete search history.

(56) References Cited

U.S. PATENT DOCUMENTS

| | | | | |
|---|---|---|---|---|
| 4,433,209 A | * | 2/1984 | Kurosawa et al. | 381/1 |
| 5,783,926 A | * | 7/1998 | Moon et al. | 320/106 |
| 7,130,184 B2 | * | 10/2006 | Choi | 361/679.23 |
| 7,836,216 B2 | * | 11/2010 | Kashi et al. | 710/15 |

FOREIGN PATENT DOCUMENTS

JP 2002-141980 A 5/2002

* cited by examiner

*Primary Examiner* — Vinh Nguyen
(74) *Attorney, Agent, or Firm* — Rabin & Berdo, P.C.

(57) ABSTRACT

This method is applied to a dual-use jack of an electronic device. Either a headphone plug or a line output plug is inserted into the dual-use jack. The method determines the type of a plug connected to the dual-use jack when the plug is inserted into the dual-use jack. The determination is made based on a load resistance of the plug connected to the jack. The method includes feeding an electric current through the load resistance in a first direction. The method compares a voltage across the load resistance to a reference voltage and determines the type of the plug in use. The method also includes feeding an electric current through the load resistance in a second direction. This electric current can reduce or eliminate a pop-noise when the plug type is determined. The second direction is different from the first direction.

16 Claims, 4 Drawing Sheets

METHOD AND CIRCUITRY FOR IDENTIFYING TYPE OF PLUG CONNECTED TO A DUAL-USE JACK

BACKGROUND OF THE INVENTION

1. Field of the Invention

The present invention generally relates to a dual-use jack, which is an audio signal output jack, designed to receive a headphone plug or a line output plug, and more particularly to a method and circuitry for determining whether a headphone plug or a line output plug is connected to the dual-use jack.

2. Description of the Related Art

Portable electronic devices such as portable audio players, digital cameras and digital video cameras have a jack for headphone. With function and performance developments of the portable electronic devices as well as wide spread use thereof, the portable electronic devices are also equipped with another jack (i.e., stereo terminal) that is used for line output.

Separately providing one jack for headphone and another jack for line output will hinder size reduction and weight reduction of the portable electronic device. Thus, a single jack (or dual-use jack) is often used, which can be used for the headphone plug and line output plug. When a single dual-jack is used, it is difficult for the electronic device to know for which purpose the jack is used (i.e., for headphone or for line output). In order to know usage of the jack that has received a plug, a certain voltage is applied across a load resistance of the plug (i.e., headphone plug or line output plug), and a resulting current is measured. The current value is used to obtain (calculate) a value of the load resistance, and the calculated value of the load resistance will determine the usage (i.e., whether the jack is connected to the headphone plug or to the line output plug) of the dual-use jack. Japanese Patent Application Kokai (Laid-Open) No. 2002-141980 discloses a control unit that can determine the usage of such dual-use jack after a test current is caused to flow through the plug.

SUMMARY OF THE INVENTION

When a voltage is applied to the plug and jack while the plug is received in the dual-use jack, the voltage activates the headphone or speaker and creates a pop-noise.

It is an object of the present invention to provide a method of determining usage of a dual-use jack with a reduced pop-noise or no pop-noise.

Another object of the present invention is to provide a circuitry for determining the usage of a dual-use jack with a reduced or no pop-noise.

According to a first aspect of the present invention, there is provided an improved method of determining a plug type in use (i.e., a type of a plug connected to a dual-use jack), based on a load resistance of the plug connected to the dual-use jack. The method includes causing an electric current to flow through the load resistance in a first direction. The method also includes comparing a voltage across the load resistance to a reference voltage to determine the plug type in use. The method also includes causing another electric current to flow through the load resistance in a second direction. The second direction is different from the first direction. By causing the electric current to flow in the second direction, a pop-noise is eliminated or reduced. The plug may be a headphone plug or a line output plug. The current flowing in the first direction may have the same absolute value as the current flowing in the second direction, but may have an opposite polarity to the current flowing in the second direction. Time for causing the first current to flow in the first direction may be equal to time for causing the second current to flow in the second direction in one embodiment, but it may be different from time for causing the second current to flow in the second direction in another embodiment.

According to a second aspect of the present invention, there is provided a circuitry for determining a plug type in use, based on a load resistance of a plug connected to a dual-use jack. The circuitry includes a voltage feed circuit for feeding a positive and negative voltage to the load resistance of the plug connected. The circuitry also includes a comparator circuit for generating a voltage that corresponds to the load resistance. The circuitry also includes a determination unit for determining the plug type in use, based on an output voltage of the comparator circuit. The circuitry also includes a control unit for adjusting a first period of feeing the positive voltage to the load resistance and a second period of feeding the negative voltage to the load resistance. The plug may be a headphone plug or a line output plug. The first period may be equal to the second period in one embodiment, but the first period may be different from the second period in an alternate embodiment. The first and second periods may be shorter than ten microseconds.

These and other objects, aspects and advantages of the present invention will become apparent to those skilled in the art from the following detailed description when read and understood in conjunction with the appended claims and drawings.

DETAILED DESCRIPTION OF THE INVENTION

Hereinafter, embodiments of the present invention will be described in detail with reference to the accompanying drawings.

Figure 1:
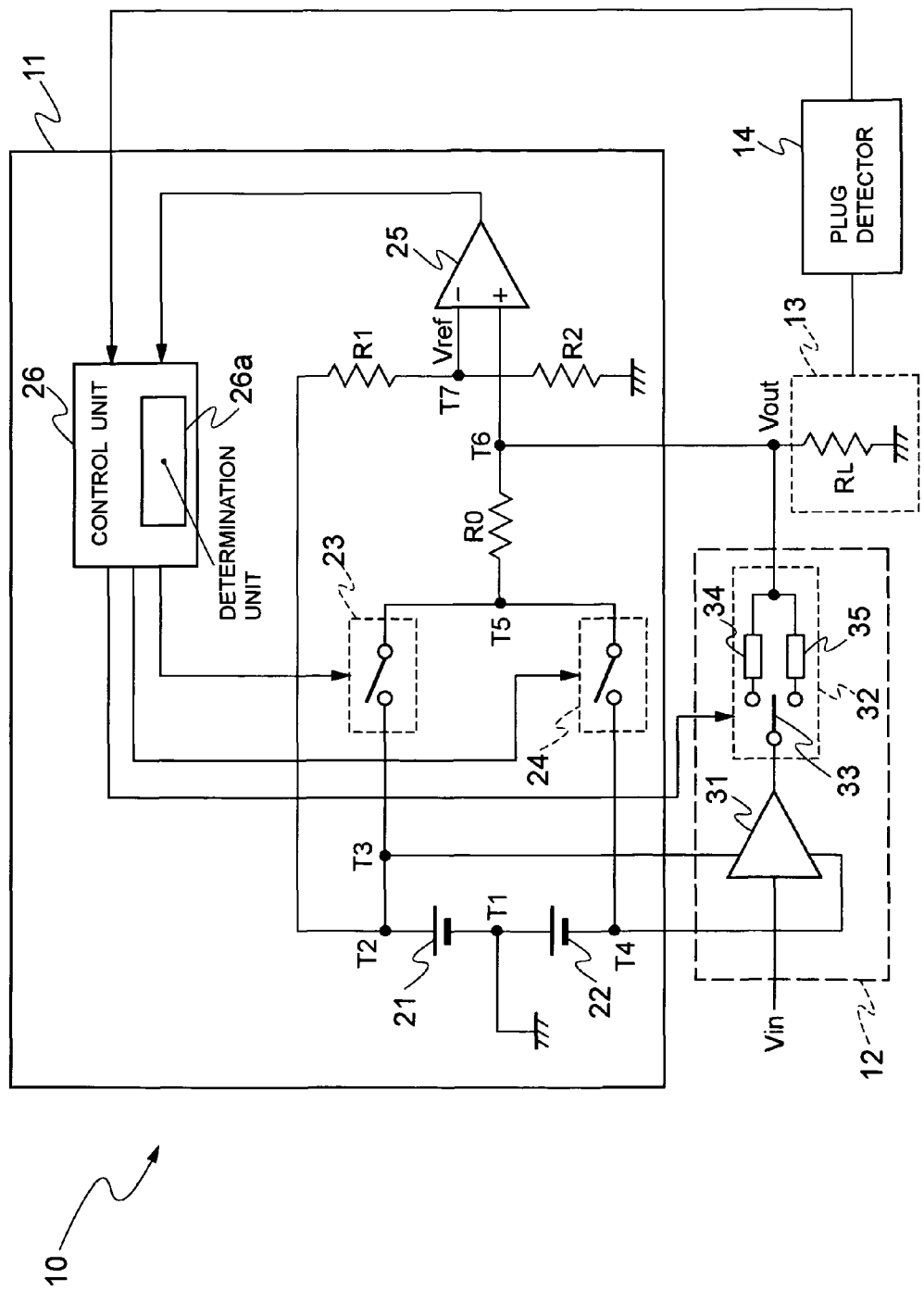
FIG. 1 is a schematic block diagram of a signal output device having a plug type determination circuit according to one embodiment of the present invention.

Referring to FIG. 1, a signal output device 10 will be described. Typically, the signal output device 10 is located inside a portable electronic device such a portable audio player, digital camera and digital video camera.

As shown in FIG. 1, the signal output device 10 includes a plug type determination circuit 11, an output control circuit 12, a jack 13 and a plug detector 14. The jack 13 is a dual-use jack that can receive a headphone plug or a line output plug in this embodiment.

The plug type determination circuit 11 has a first power source 21, second power source 22, first switch 23, second switch 24, resistances R0, R1, R2, comparator 25 and control unit 26. The first switch 23 takes an on condition or an off condition, and the second switch 24 also takes an on condition or an off condition. The control unit 26 has a determination part 26a to determine the plug type in use (i.e., the type of the plug connected to the jack 13). The first power source 21, second power source 22, first switch 23, second switch 24 and resistance R0 constitute in combination a voltage feed circuit.

The first power source 21 is serially connected to the second power source 22 via a connection point T1. The connection point T1 is grounded. A positive terminal (or pin) of the first power source 21 is connected to the first switch 23 via connection points T2 and T3. The positive terminal of the first power source 21 is also connected to the resistance R1 via the connection point T2. A negative terminal of the second power source 22 is coupled to the second switch 24 via a connection point T4. The voltage of the first power source 21 is Vdd, and the voltage of the second power source 22 is Vss. In this embodiment, the voltage of the first power source 21 (Vdd) is equal to that of the second power source 22 (Vss).

One end of the first switch 23 is connected to the resistance R0 via a connection point T5. Likewise, one end of the second switch 24 is connected to the resistance R0 via the connection point T5. The right end of the resistance R0 is connected to a positive input of the comparator 25 via a connection point T6. A negative input of the comparator 25 is connected to the resistances R1 and R2 via a connection point T7. Accordingly, a reference voltage Vref that is decided by the resistances R1 and R2 is supplied to the negative input of the comparator 25. The resistances R1 and R2 constitute in combination a voltage divider for the first power source 21. The output of the comparator 25 is connected to the control unit 26. Thus, the comparator 25 supplies a voltage, which is obtained by subtracting the reference voltage Vref from a voltage divided by the resistance R0 and a resistance RL of a plug connected to the jack 13, to the control unit 26. The resistance R0 and plug resistance RL constitute a voltage divider. Because the value of the resistance R0 can be changed, a value of the voltage supplied to the positive input of the comparator 25 can be changed. Specifically, a desired voltage can be supplied to the positive input of the comparator 25 by adjusting the value of the resistance R0.

One end of the resistance R2 is connected to the resistance R1 via the connection point T7. The other end of the resistance R2 is grounded. The control unit 26 is connected to the first switch 23 and second switch 24. The control unit 26 supplies an ON signal (connecting signal) or OFF signal (disconnecting signal) to the first switch 23 and second switch 24.

The output control circuit 12 has an amplifier 31 and switchover circuit 32. An input of the amplifier 31 is connected to an audio output of the portable electronic device (not shown). An audio output signal Vin is introduced to the input of the amplifier 31. The output of the amplifier 31 is connected to the switchover circuit 32. The power source pin of the amplifier 31 is connected to a positive pin of the first power source 21 via the connection points T2 and T3. The power source pin of the amplifier 31 is also connected to a negative pin of the second power source 22 via the connection point T4.

The switchover circuit 32 has a third switch 33, line output circuit 34 and headphone circuit 35. One end of the third switch 33 is connected to the output pin of the amplifier 31. The other end of the third switch 33 is connectable to either the line output circuit 34 or the headphone circuit 35. The right end of the line output circuit 34 is connected to the jack 13. Likewise, the right end of the headphone circuit 35 is connected to the jack 13. The switchover circuit 32 is connected to the control unit 26. The control unit 26 supplies a selection signal, which selects either the line output circuit 34 or the headphone circuit 35, or an OFF signal, which selects none of the two circuits 34 and 35, to the switchover circuit 32.

The jack 13 is connected to the switchover circuit 32. The plug detector 14 is connected to the jack 13 and determines whether a plug (headphone plug or line output plug) is coupled to the jack 13. FIG. 1 illustrates that the jack 13 has received the plug. In other words, the plug being received in the jack 13 is represented by the load resistance RL being connected to the switchover circuit 32 and ground. The value of the load resistance RL depends on the type of the plug connected to the jack 13. For example, the resistance value RL is 100 ohm (O) or less if the plug is a headphone plug. The resistance value RL is about 10 kilo-ohm (kO) if the plug is a line output plug. The output voltage Vout is supplied to the jack 13.

The plug detector 14 is connected to the jack 13 and control unit 26. When the plug detector 14 detects that the plug is engaged into the jack 13, it sends a detection signal to the control unit 26. The plug detector 14 may be a contact sensor or optical sensor.

Figure 2:
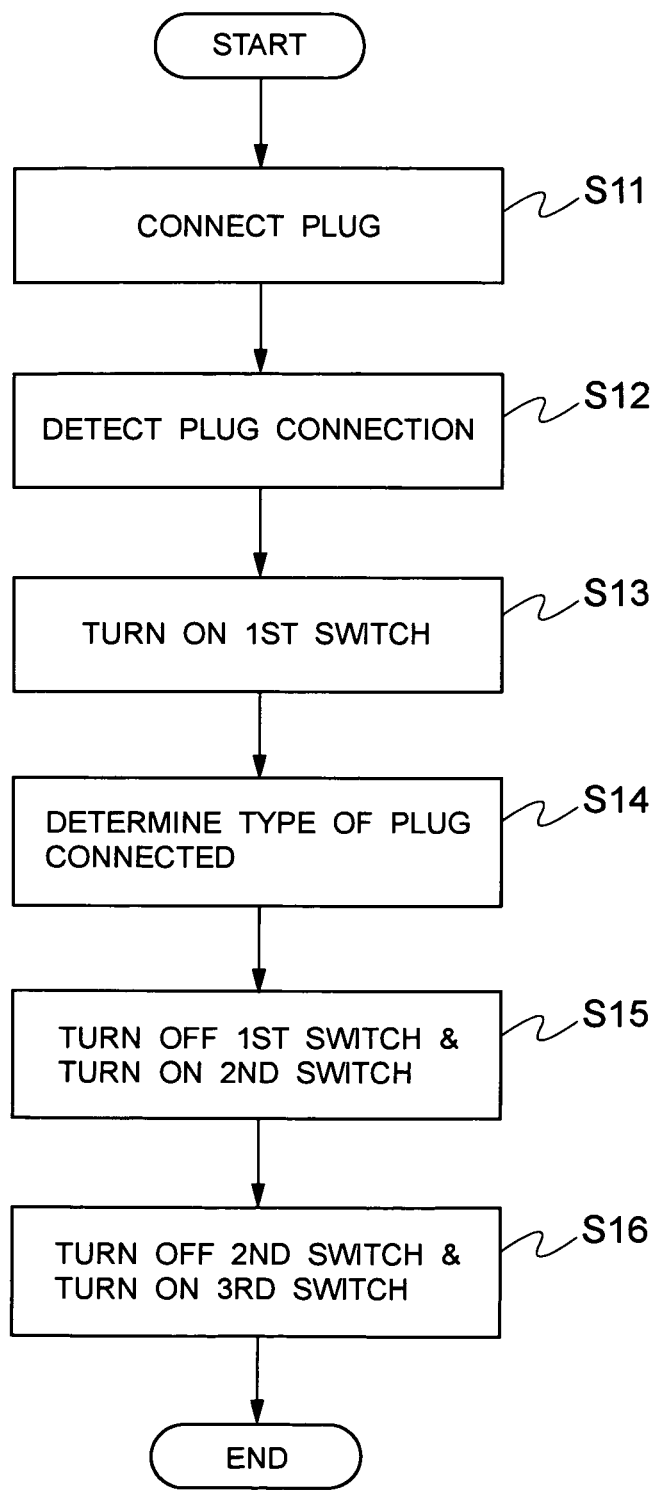
FIG. 2 is a flowchart that shows an operation of the signal output device shown in FIG. 1 when the plug type determination circuit determines a plug type.
Figure 3:
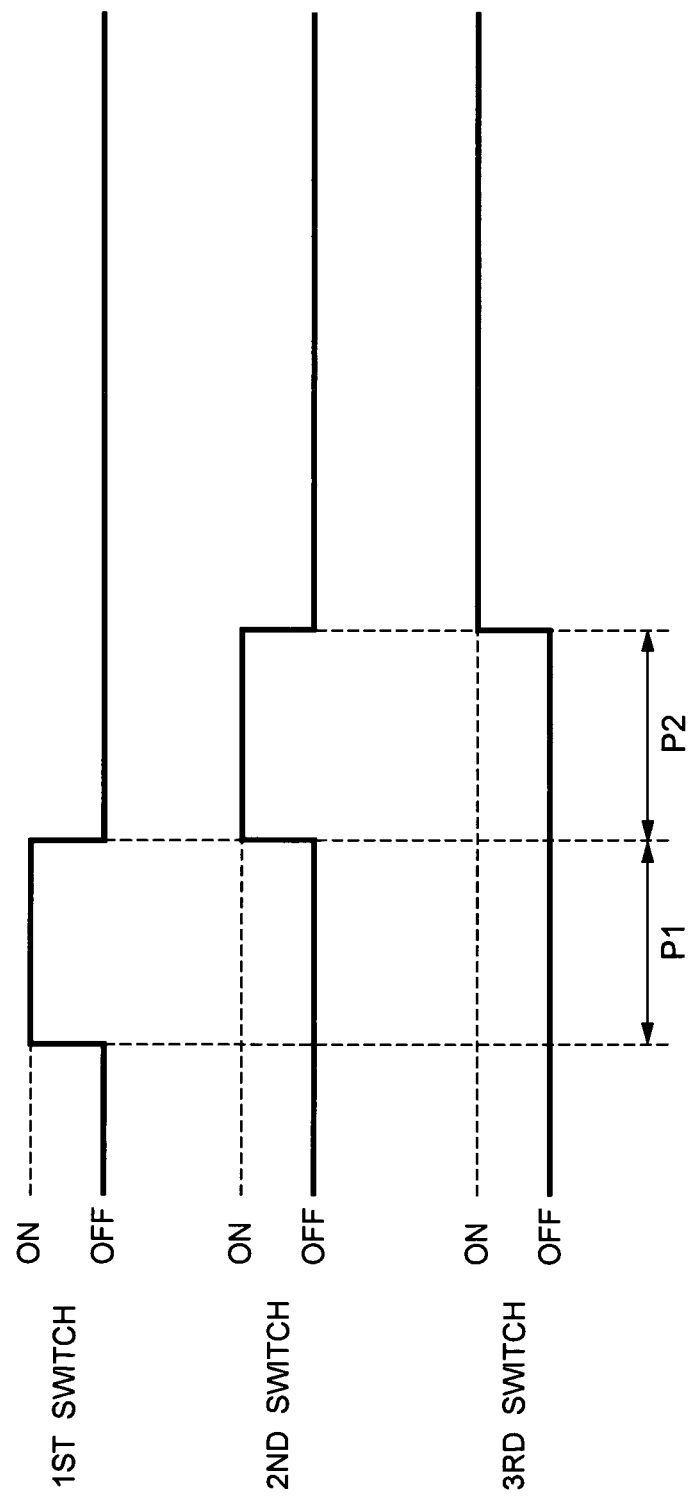
FIG. 3 is a timing chart that shows turning on and off of respective switches in the signal output device shown in FIG. 1.
Figure 4:
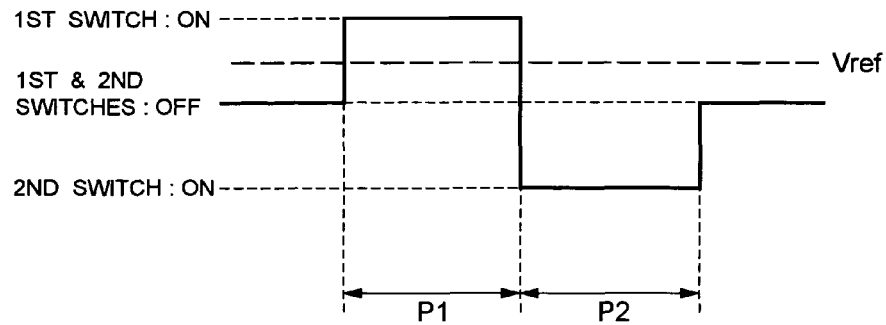
FIG. 4 shows voltages supplied to a comparator positive input and jack, based on the turning on and off of the relevant switches.

Referring also to FIG. 2 to FIG. 4, the operation of the signal output device 10 when the plug is inserted into the jack 13 will be described. FIG. 2 shows the flowchart. FIG. 3 is an ON/OFF timing chart for the respective switches. FIG. 4 shows a voltage change that is supplied to the positive input of the comparator 25 and jack 13.

Upon engagement of the plug into the jack 13 (Step S11), the plug detector 14 detects that the plug is received in the jack 13 (Step S12), and sends a plug detection signal, to the control unit 26. The following description deals with a case where the line output plug (not shown) is received in the jack 13.

Upon receiving the plug detection signal, the control unit 26 generates and sends an ON signal, which turns on the first switch 23, to the first switch 23. The first switch 23 receives the ON signal and enters an ON state (Step S13: see also FIGS. 3 and 4).

As the first switch 23 enters the ON state, an electric current flows from the first power source 21 to the load resistance RL through the connection point T3, first switch 23, connection point T5, resistance R0 and connection point T6. In this embodiment, the direction from the first power source 21 toward the load resistance RL is referred to as "first direction." As the electric current flows, a voltage divided by the resistances R0 and RL is introduced to the positive input of the comparator 25 and jack 13. Because the negative pin of the first power source 21 is grounded, the voltage supplied to the comparator positive pin and jack 13 has a positive value (see FIG. 4). Because the reference voltage Vref is supplied to the negative pin of the comparator 25, a voltage which is obtained by subtracting the reference voltage Vref from the above-mentioned divided voltage, is supplied to the control unit 26 from the comparator 25. The reference voltage Vref is already optimized (will be described later). Thus, the voltage value from the comparator 25 when the line output plug is connected to the jack 13 is different from the voltage value when the headphone plug is connected to the jack 13. Based on the supplied voltage, the control unit 26 determines whether the line output plug is connected to the jack 13 or the headphone plug is connected to the jack 13 (Step S14). Time from the turning on of the first switch 23 to the plug type determination made by the control unit 26 is referred to as first period P1. For example, the first period P1 is between one microsecond (μsec) and ten microseconds (μsec).

The control unit 26 supplies an ON signal to the second switch 24 while the control unit 26 sends an OFF signal to the first switch 23. Thus, the first switch 23 is brought into the off state and the second switch is brought into the on state (Step S15; FIGS. 3 and 4).

As the second switch 24 turns on, an electric current flows from the load resistance RL to the second power source 22 through the resistance R0, connection point T5 and second switch 24. Accordingly, the electric current flows in the resistance RL in a direction different from the first direction. This direction (i.e., direction from the load resistance RL toward the second power source 22) is referred to as "second direction." Then, a voltage divided by the resistances R0 and RL is supplied to the positive input of the comparator 25 and jack 13. Because the positive pin of the second power source 22 is grounded, the voltage supplied to the comparator positive pin and jack 13 has a negative value. Because the first power source voltage is equal to the second power source voltage (Vdd=Vss), the absolute value of a voltage when the first ON/OFF switch 23 is in an on state is equal to the absolute value of a voltage when the second ON/OFF switch 24 is in an on state although these two voltages have opposite polarities (one is positive and the other is negative: see FIG. 4).

When a certain period, which is equal to the first period P1, elapses after the turning on of the second switch 24, the control unit 26 supplies an OFF signal to the second switch 24 and a selection signal to the switchover circuit 32. Accordingly, the second switch 24 is brought into the off state and the third switch 33 is brought into the on state. Because the line output plug is connected to the device 1 in this embodiment, the third switch 33 is connected to the line output circuit 34, and the output of the amplifier 31 is connected to the jack 13 via the line output circuit 34 (Step S16; FIG. 3). The period of the second switch 24 being in the on state is referred to as "second period P2." The second period P2 is between one microsecond and ten microseconds, and the second period P2 is equal to the first period P1.

As mentioned earlier, the voltage fed to the jack 13 in the first period P1 and the voltage fed to the jack 13 in the second period P2 have the same absolute value with the opposite polarities. In addition, the voltage feeding time for these two voltages is the same (P1=P2). The electric current fed to the jack 13 in the first period P1 and the electric current fed to the jack 13 in the second period P2 have the same absolute value. Therefore, a signal fluctuating in positive and negative directions is fed to the load resistance RL. Accordingly, the changing output voltage during the positive voltage feeding time counterbalances the changing output voltage during the negative voltage feeding time. Because the signal supplied to the load resistance RL reduces the signal amplitude (or oscillation) in the audible frequency range, the pop-noise is reduced or eliminated. If the first period P1 and second period P2 are longer than ten microseconds, the voltage application time to the jack 13 becomes long and this can hinder the pop-noise reduction/elimination. This is because an audible noise is perceived in the first and second periods P1 and P2, even if a signal fluctuating in the positive and negative directions is supplied to the jack 13. As such, it is preferred that the first and second periods P1 and P2 be shorter than ten microseconds respectively.

After Step S16, the output voltage Vout is supplied to the jack 13 while the input voltage Vin (i.e., audio signal) is being supplied to the amplifier 31, as shown in FIG. 3.

Figure 5A:
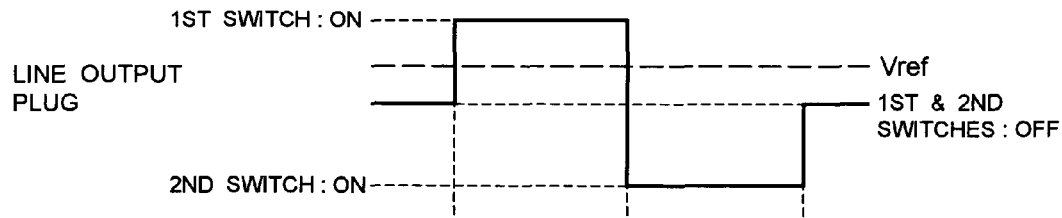
FIG. 5A shows a voltage supplied to the comparator positive input and jack when a line output plug is engaged with the jack.
Figure 5B:
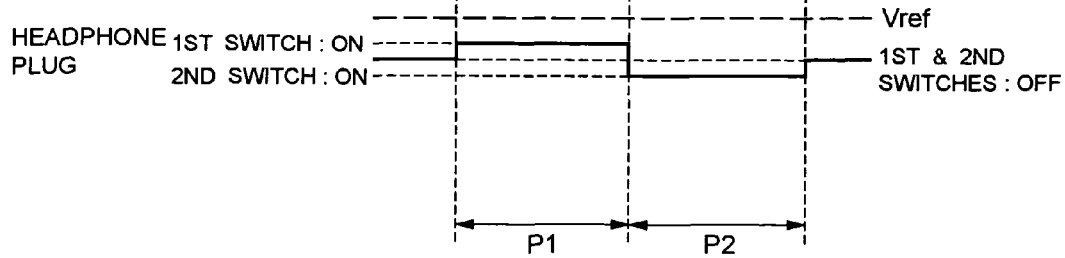
FIG. 5B shows a voltage supplied to the comparator positive input and jack when a headphone plug is engaged with the jack.

Optimization of the reference voltage Vref will be described with reference to FIGS. 5A and 5B. FIG. 5A shows the output voltage Vout that is introduced to the jack 13 and comparator positive input when the line output plug is inserted into the jack 13, and FIG. 5B shows the output voltage Vout when the headphone plug is inserted into the jack 13.

In general, the resistance value of the line output plug is greater than that of the headphone plug. For example, the resistance value of the headphone plug is less than 100 ohm (O), and the resistance value of the line output plug is about ten kilo-ohm (kO). As such, the absolute value of the output voltage when the line output plug is connected to the jack 13 is greater than the absolute value of the output voltage when the headphone plug is connected to the jack 13.

Therefore, if the reference voltage Vref supplied to the negative input of the comparator 25 has a value between the voltage value when the line output plug is connected to the jack 13 and the voltage value when the headphone plug is connected to the jack 13, then the comparator 25 is able to determine whether the headphone plug or line output plug is connected to the jack 13. By setting the reference voltage value Vref in this manner, it is possible to determine the plug type in use, based on the voltage output from the comparator 25. The value of the reference voltage Vref can be changed by altering the values of the resistances R1 and/or R2.

With the reference voltage Vref being decided (optimized) in the above-described manner, if the voltage from the comparator 25 has a positive value, then it means that the line output plug is connected to the jack 13, and if the voltage from the comparator 25 has a negative value, then it means that the headphone plug is connected to the jack 13. In the illustrated embodiment, the line output plug is connected to the jack 13, and therefore a positive voltage comes out from the comparator 25.

The present invention is characterized by a fact that an electric current is caused to flow in different directions through the load resistance. With this fact, the waveform of the output voltage when the electric current flows in the first direction counterbalances the waveform of the output voltage when the electric current flows in the second direction. As a result, it is possible to reduce or eliminate pop-noises while the resistance value of the load resistance is measured to determine the plug type in use.

The present invention is not limited to the above-described embodiment. Various changes and/or modifications may be made without departing from the spirit and scope of the present invention. For example, the following modifications can be made.

Although the first period P1 has the same length as the second period P2 in the above-described embodiment, the present invention is not limited in this regard. The first period P1 may have a different length from the second period P2 as long as the pop-noise reduction can be achieved.

Although the negative voltage is supplied after the positive voltage is supplied in the above-described embodiment, the positive voltage may be supplied after the negative voltage is supplied.

This application is based on Japanese Patent Application No. 2009-270059 filed on Nov. 27, 2009, and the entire disclosure thereof is incorporated herein by reference.

What is claimed is:

1. A method of determining a type of a plug connected to a dual-use jack, based on a load resistance of the plug connected to the dual-use jack, said method comprising:
   causing an electric current to flow through the load resistance in a first direction;
   comparing a voltage across the load resistance to a reference voltage to determine the type of the plug connected; and causing another electric current to flow through the load resistance in a second direction, said second direction being different from the first direction for reducing pop noise caused by the current flowing in the first direction.

2. The method according to claim 1, wherein a period of causing the electric current to flow in the first direction is equal to a period of causing the another electric current to flow in the second direction.

3. The method according to claim 2, wherein the period of causing the electric current to flow in the first direction is shorter than ten microseconds, and the period of causing the another electric current to flow in the second direction is also shorter than ten microseconds.

4. The method according to claim 3, wherein an absolute value of the electric current is equal to that of the another electric current.

5. The method according to claim 1, wherein the plug is a headphone plug or a line output plug.

6. The method according to claim 5, wherein the load resistance of the headphone plug is 100 ohms or less, and the load resistance of the line output plug is 10,000 ohms.

7. The method according to claim 1, wherein a period of causing the electric current to flow in the first direction is different from a period of causing the another electric current to flow in the second direction.

8. A circuit for determining a type of a plug connected to a dual-use jack, based on a load resistance of the plug connected to the dual-use jack, said circuit comprising:

a voltage feed circuit for feeding a positive and negative voltage to the load resistance;

a comparing circuit for generating a voltage that is decided by the load resistance;

a determination unit for determining the type of the plug connected, based on the generated voltage of the comparing circuit; and a control unit for adjusting a first period of feeing the positive voltage to the load resistance and a second period of feeding the negative voltage to the load resistance.

9. The circuit according to claim 8, wherein the control unit functions such that the first period becomes equal to the second period.

10. The circuit according to claim 9, wherein the voltage feed circuit includes a first power source for supplying the positive voltage, a second power source for supplying the negative voltage, a first switch connected to the first power source, a second switch connected to the second power source, and a resistor connected to the load resistance for dividing the first power source voltage and second power source voltage.

11. The circuit according to claim 10, wherein a voltage value of the first power source is equal to that of the second power source.

12. The circuit according to claim 9, wherein the first period is shorter than ten microseconds, and the second period is also shorter than ten microseconds.

13. The circuit according to claim 8, wherein the plug is a headphone plug or a line output plug.

14. The circuit according to claim 13, wherein the load resistance of the headphone plug is 100 ohms or less, and the load resistance of the line output plug is 10,000 ohms.

15. The circuit according to claim 13, wherein the determination unit determines that the plug connected to the dual-use jack is the headphone plug when the generated voltage of the comparing circuit has a negative value, and determines that the plug connected to the dual-use jack is the line output plug when the generated voltage of the comparing circuit has a positive value.

16. The circuit according to claim 8, wherein the first period is different from the second period.

* * * * *